(12) United States Patent
Sugimoto et al.

(10) Patent No.: US 7,217,153 B2
(45) Date of Patent: May 15, 2007

(54) ELECTRONIC CIRCUIT APPARATUS AND PRODUCTION METHOD THEREOF

(75) Inventors: Keiichi Sugimoto, Kariya (JP); Mitsuru Nakagawa, Chiryu (JP)

(73) Assignee: Denso Corporation, Kariya, Aichi-pref. (JP)

( * ) Notice: Subject to any disclaimer, the term of this patent is extended or adjusted under 35 U.S.C. 154(b) by 0 days.

(21) Appl. No.: 11/406,365

(22) Filed: Apr. 19, 2006

(65) Prior Publication Data

US 2006/0245146 A1 Nov. 2, 2006

(30) Foreign Application Priority Data

Apr. 28, 2005 (JP) .............................. 2005-130722

(51) Int. Cl.
*H01R 3/00* (2006.01)
(52) U.S. Cl. ........................................ 439/500; 429/96
(58) Field of Classification Search ................ 439/500, 439/566, 627; 429/96
See application file for complete search history.

(56) References Cited

U.S. PATENT DOCUMENTS

| | | | | |
|---|---|---|---|---|
| 5,528,460 A * | 6/1996 | Byrd | ........................... | 361/752 |
| 5,707,249 A * | 1/1998 | Byrd | ........................... | 439/500 |
| 5,823,820 A * | 10/1998 | Patel et al. | ................... | 439/500 |
| 5,863,674 A * | 1/1999 | Yamanaka | ................... | 429/100 |
| 5,876,108 A * | 3/1999 | Chien | ........................... | 362/35 |
| 5,922,489 A * | 7/1999 | Adachi | ........................ | 429/100 |
| 5,993,248 A * | 11/1999 | Bethurum | ................... | 439/500 |
| 6,062,901 A | 5/2000 | Liu et al. | | |
| 6,231,370 B1 * | 5/2001 | Morin et al. | ................. | 439/366 |
| 6,293,819 B1 * | 9/2001 | Wu | ............................. | 439/500 |
| 6,395,980 B2 * | 5/2002 | Iitsuka | ........................ | 174/50 |
| 6,600,291 B2 * | 7/2003 | Pautet et al. | ................. | 320/103 |
| 7,018,736 B2 * | 3/2006 | Nakajima et al. | ............. | 429/96 |
| 2002/0060550 A1 * | 5/2002 | Pautet et al. | ................. | 320/103 |

FOREIGN PATENT DOCUMENTS

| | | |
|---|---|---|
| JP | 03-258195 | 11/1991 |
| JP | 11-346418 | 12/1999 |
| JP | 2004-52471 | 2/2004 |

* cited by examiner

*Primary Examiner*—Neil Abrams
*Assistant Examiner*—Phuongchi Nguyen
(74) *Attorney, Agent, or Firm*—Nixon & Vanderhye P.C.

(57) ABSTRACT

A casing of an electronic key communicating apparatus is formed by sealing with epoxy resin a printed circuit board, a front surface of which a circuit component and end portions of each terminal are mounted on. A rear surface of the circuit board is used as a part of an outer surface of the casing. The circuit board includes a recess line portion to surround a button battery. The terminals are mounted on the printed circuit to cross the recess line portion. This structure allows a slide type mold to be used, decreasing the thickness of the casing and enhancing productivity.

6 Claims, 2 Drawing Sheets

ELECTRONIC CIRCUIT APPARATUS AND PRODUCTION METHOD THEREOF

CROSS REFERENCE TO RELATED APPLICATIONS

This application is based on and incorporates herein by reference Japanese Patent Application No. 2005-130722 filed on Apr. 28, 2005.

FIELD OF THE INVENTION

The present invention relates to an electronic circuit apparatus and a production method thereof, for example, in a vehicular electronic key system.

BACKGROUND OF THE INVENTION

A conventional electronic circuit apparatus such as a communicating apparatus in a vehicular electronic key system has a casing to contain a battery and a circuit board on which electronic components are mounted (Patent Document 1).

Patent Document 1: JP-2004-52471 A

A main body of the casing is formed of a flat card-shaped box having a bottom to include a circuit-board containing portion and battery containing portion, which contain the circuit board and battery, respectively. The circuit board and battery are hermetically enclosed in the main body of the casing using a covering sheet, i.e., a lid. Each terminal, an end portion of which is soldered on the circuit board, is extended into the battery container to be pressed to contact the battery; therefore, each terminal is previously deformed to bend towards a battery position where the battery is to be inserted.

In the conventional electronic circuit apparatus, both the front and rear surfaces of the circuit board are enclosed within the casing, increasing the thickness of the casing or the apparatus to possibly worsening portability.

To decrease the thickness of the apparatus, the following method can be adopted: one surface of a circuit board, on which an electronic component is mounted, is sealed with resin to form a casing; the other surface of the circuit board having no electronic component mounted is used as an outer surface of the casing. Here, when the casing is molded with resin, a mold for forming a battery containing space is required.

However, since the above terminal needs to be previously deformed to bent towards the battery position, the mold for forming the battery containing space cannot be a slide type mold, which will be prevented from moving by the bent terminal. Consequently, the mold becomes complicated.

Each terminal needs to be soldered on the circuit board at its end portion and to contact the battery at the other end portion; therefore, the terminal is considerably extended from the circuit board where the end portion is soldered. This makes it difficult for the circuit board to securely support the terminal. Consequently, the terminal is soldered on the circuit board by hand, instead of being automatically mounted. The number of production processes for producing the electronic circuit apparatus increases, posing a problem.

SUMMARY OF THE INVENTION

It is an object of the present invention to provide an electronic circuit apparatus and a production method thereof to help solve the above problem. Namely, a structure of the apparatus allows a production method to use a slide type mold in forming a casing by sealing a circuit board with resin, decreasing the number of production processes and the thickness of the apparatus.

To achieve the above object, an electronic circuit apparatus, to which a battery of a button type is to be inserted as a power source, is provided with the following: An electronic component is included; a positive terminal is included for contacting a positive electrode of the battery; a negative terminal is included for contacting a negative electrode of the battery; a circuit board is included for including a recess line portion, wherein the electronic component and both end portions of each of the positive terminal and the negative terminals are attached to a first surface of the circuit board; and a casing is included for including the circuit board by sealing, using resin, the circuit board in addition to the electronic component and the both end portions of each of the positive terminal and the negative terminal. A second surface opposite to the first surface of the circuit board is included as a part of an outer surface of the casing. The casing further includes a battery containing space, which is surrounded by the recess line portion of the circuit board, for detachably containing the battery. A part of each of the positive terminal and the negative terminal appears within the battery containing space. When the battery is not inserted, a distance between the positive terminal and the negative terminal in a direction of a thickness of the battery that is to be inserted is shorter than the thickness of the battery.

Under the above structure, in a molding process where the casing is molded with resin to include the circuit board, a mold for forming the battery containing space can be inserted to a gap between both the terminals from an opening portion facing the recess line portion of the circuit board. Namely, a slide type mold can be used in the production method of the electronic circuit apparatus, decreasing the number of production processes.

In this case, a pressing process can be applied subsequently after the molding process is completed. Namely, the pressing process can be applied after the molding process to enable the terminals to contact the battery with pressure, i.e., to cause a distance between both the terminals in a direction of a thickness of the battery to be shorter than the thickness of the battery.

Furthermore, under the above structure, the second surface of the circuit board where no component is mounted can be used as a part of the outer surface of the casing. This can eliminate the necessity of an additional separate outer surface wall of the casing, decreasing the thickness of the electronic circuit apparatus.

In contrast, a production method for producing the electronic circuit apparatus described above is provided with the following processes: filling the cavity with a liquid of the resin; solidifying the liquid of the resin within the cavity; releasing off the mold the casing, which has been formed after the solidifying the liquid of the resin; and applying a pressing process to the positive terminal and the negative terminal within the battery containing space to cause the distance between the positive terminal and the negative terminal in the direction of the thickness of the battery to be shorter than the thickness of the battery.

Under the above production method, when before the casing is molded with resin to include the circuit board, the terminals still have flat shapes parallel to each other without having been deformed. Therefore, a slide type mold to be inserted into a gap between the terminals can be used for forming the battery containing space.

BRIEF DESCRIPTION OF THE DRAWINGS

The above and other objects, features, and advantages of the present invention will become more apparent from the following detailed description made with reference to the accompanying drawings. In the drawings.

DETAILED DESCRIPTION OF THE PREFERRED EMBODIMENTS

Figure 1:
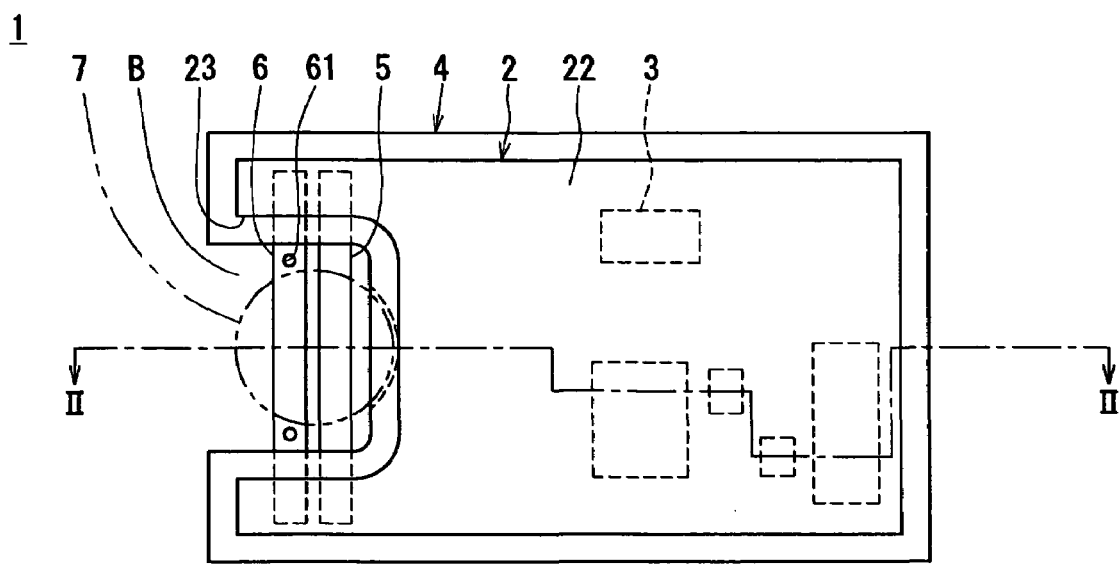
FIG. 1 is a plan view of an electronic key communicating apparatus according to an example embodiment of the present invention.
Figure 2:
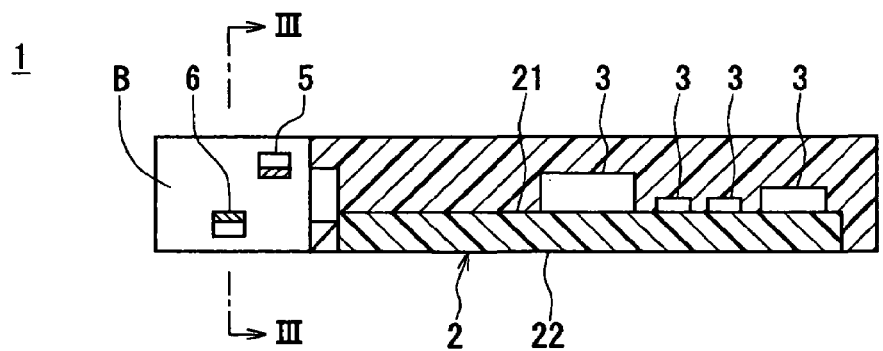
FIG. 2 is a sectional view taken from a line II to II in FIG. 1.

A communicating apparatus (transmitting/receiving apparatus) of a vehicular electronic key system as an electronic circuit apparatus according to an example embodiment will be explained below. As shown in FIGS. 1, 2, an electronic key communicating apparatus 1 is constructed mainly of a casing 4. The casing 4 includes a circuit board 2, a circuit component 3, and positive and negative terminals 5, 6. The circuit component 3 is mounted on a first surface (e.g., front surface or mounting surface) of the circuit board 2; two end portions of each of the positive and negative terminals 5, 6 are mounted on the first surface of the circuit board 2. Then, the casing 4 is formed by sealing with resin the circuit board 2 in addition to the mounted circuit component 3 and the end portions of each of the terminals 5, 6. Here, the casing 4 includes a battery containing space B for containing a battery 7 of a button type as a power source of the apparatus 1. This battery is to be inserted into the battery containing space B; then a battery cover (not shown) is to be attached to cover the battery 7.

The circuit board 2 is, e.g., a printed circuit board, in which an electrically conductive material such as copper foil is formed on, e.g., a glass epoxy board, ceramic board, etc.

The circuit component 3 mounted on the circuit board 2 includes various devices or units such as a resistor, capacitor, diode, transistor, IC, or antenna. As explained above, these devices or units are only mounted on the first surface 21 of the circuit board 2. A second surface 22 (e.g., rear surface) opposite to the first surface 21 is a flat surface without any mounted devices.

As shown in the plan view in FIG. 1, the circuit board 2 includes a recess line portion 23 for forming an area to contain the battery 7. The positive and negative terminals 5, 6 are arranged to appear or be viewed (vertically in FIG. 1) to cross (or bridge) the battery containing space B and further the recess line portion 23; both ends of each of the terminals 5, 6 are soldered on wiring patterns (not shown) formed on the mounting surface 21 in vicinity of the concave line portion 23. Thus, the positive and negative terminals 5, 6 are to contact a positive and negative electrodes of the battery 7 within the battery containing space B, respectively.

In this mounting structure of each terminal 5, 6, both ends of each terminal 5, 6 can be stably placed in given positions; therefore, the both ends of each terminal 5, 6 can be soldered simultaneously when the circuit component 3 is mounted by automatic soldering in the mounting process.

Each terminal 5, 6 is formed of flexible conductive material such as beryllium copper plate overlaid with gold. The battery 7 (shown as chain double-dashed line in FIG. 1) can be inserted into a gap between the terminals 5, 6 to contact the terminals 5, 6 at both sides of the battery 7, respectively. The gap or distance between the terminals in a direction of a thickness of the battery 7 is defined to be a distance d1 a little larger than a thickness t of the battery 7 near each end potion. In contrast, the terminals 5, 6 have central bent portions to come close to each other around a central portion of the battery containing space B to have a distance d2 smaller than the thickness t of the battery 7.

Thus, when the batter 7 is inserted into the gap between the terminals 5, 6, the central bent portions of the terminals 5, 6 are elastically deformed to spread upward and downward (in FIG. 3), respectively; this elastic force allows the terminals 5, 6 to be pressed to contact the positive and negative electrodes of the battery, respectively. Thus, the battery 7 can provide the circuit component 3 on the circuit board with an electric power.

The casing 4 is formed by sealing the mounting surface 21 of the circuit board 2 along with the circuit component 3, and the end portions of the terminals 5, 6 and their vicinity, as shown in FIG. 2. In other words, the circuit component 3 and terminals 5, 6 are mounted on the mounting surface (first surface) of the circuit board 2 at a mounting process; the circuit board 2 after the mounting process is placed in a given position within a cavity of a metal mold while the second surface 22 of the circuit board 2 is closely attached to a wall of the metal mold; then, an insert molding process is applied to the placed circuit board 2 using resin material to form or the casing 4, to which the circuit board 2 is inserted. This causes the second surface 22 of the circuit board 2 to be exposed on a surface of the casing 4. In detail, the second surface 22 of the circuit board 2 and an adjacent surface of the resin portion of the casing 4 are smoothly joined to each other to form a single surface. In other word, the second surface 22 of the circuit board 2 is included as a part of an outer surface of the casing 4.

After the casing 4 is formed, the mounting surface 21 of the circuit board 2, the mounted circuit component 3, and the mounted end portions of the terminals 5, 6 are entirely enclosed within the resin of the casing 4. Electric circuitry within the casing 4, except portions of the terminals 5, 6 within the battery containing space B, is completely sealed, enabling the electronic key communicating apparatus 1 to be waterproof.

The casing 4 is designed to have a card type shape that is easily carried or held by a user. For instance, this card type shape can have a planar size (i.e., height and width in the plan view in FIG. 1) similar to that of a credit card (i.e., height and width of ID-1 type specified in an ISO/IEC 7816-1 standard).

The resin material of the casing 4 can be thermoset resin such as epoxy resin for this example embodiment. When the thermoset resin is used for molding, a temperature of the metal mold is necessary to be maintained to be suitable for thermosetting temperature of the resin. In this example embodiment, the circuit component 3 and terminals 5, 6 are mounted on the circuit board 2 by soldering, so that the temperature of the metal mold is sufficiently lower than a melting point (melting temperature) of the soldering material used. For instance, in this example embodiment, the melting point of the soldering material is 240 degrees Celsius and the thermosetting reaction temperature of the resin is 170 degrees Celsius.

The epoxy resin of the thermoset resin forming the casing 4 excels in a heat-resistance property and mechanical strength, which can enhance reliability of the electronic key communicating apparatus 1 that is required to be always held by a driver.

The resin material can be replaced with any other thermoset resin material without limited to the epoxy resin as long as a condition that a melting temperature of the soldering material is less than a thermosetting reaction temperature of the used resin material.

Next, a production method for producing the above electronic key communicating apparatus 1 will be explained with reference to FIGS. 4, 5, in particular, regarding a molding process for molding the casing 4 using resin.

At first, a structure of a metal mold 100 will be explained. The metal mold 100 includes an upper metal mold 101, a lower metal mold 102, and a slide core 103 of a slide type mold, as shown in FIG. 4. When the metal mold 100 is tightened up, the slide core 103 is caused to move from left to right in FIG. 4 by an incline pin or the like (not shown) and then stop at a position shown in FIG. 4. The slide core 103 defines a cavity 104 jointly with the upper and lower metal molds 101, 102. The cavity 104 is to be filled with the epoxy resin to constitute a body of the casing 4.

The upper metal mold 101 includes a sprue (hole) 105 as a passage for feeding resin via a gate 106 into the cavity 104. The lower metal mold 102 includes a knockout pin 107 and a vacuum hole 108. The knockout pin 107 is arranged to contact the second surface 22 of the circuit board 2 after the metal mold 100 is tightened up; the knockout pin 107 is used for releasing off the metal mold 100 the casing 4 as a molded object after the molding. The vacuum hole 108 is linked through a pipe (not shown) with an external vacuum pump to control a pressure of the vacuum hole 108 as need, thus sucking the circuit board 2 with negative pressure to support the circuit board 2 within the cavity 104.

Next, placing the circuit board 2 will be explained below, provided that the circuit component 3 and the terminals 5, 6 have been already mounted on the circuit board 2.

Figure 4:
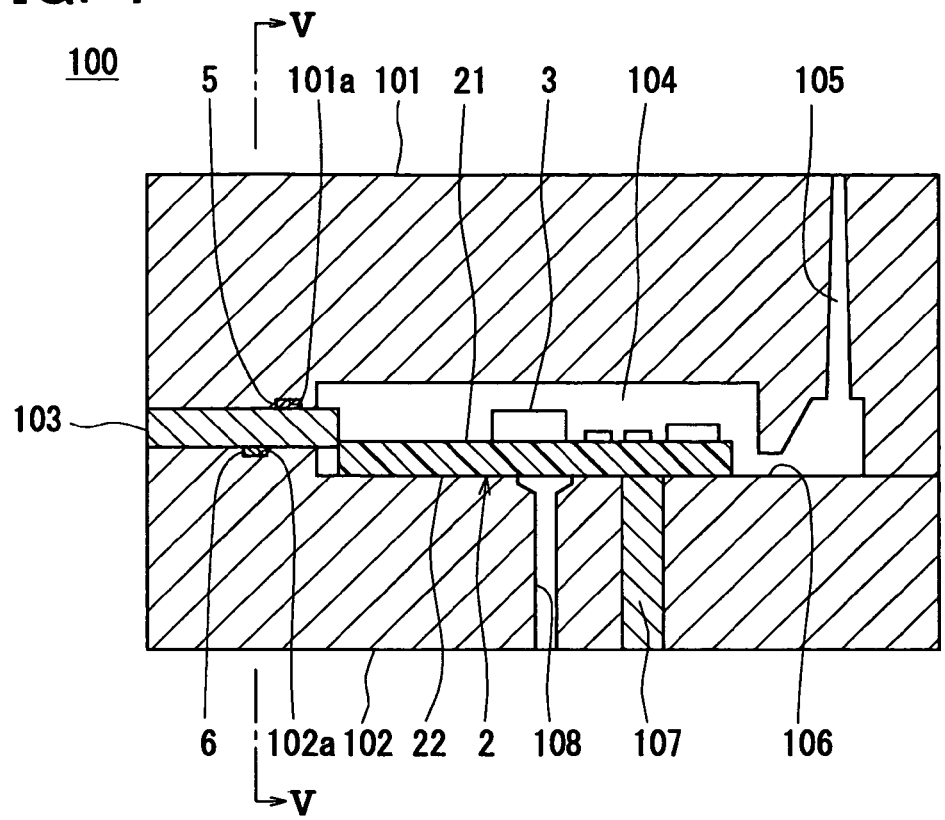
FIG. 4 is a sectional view of a metal mold used for producing the example embodiment shown in FIG. 1.

Before the metal mold 100 is tightened up, i.e., when the upper and lower metal molds 101, 102 are staying away from each other (vertically in FIG. 4) and the slide core 103 is staying leftward in FIG. 4 while contacting the lower metal mold 102, the circuit board 2 as an inserted object is placed within the cavity 104.

Figure 5:
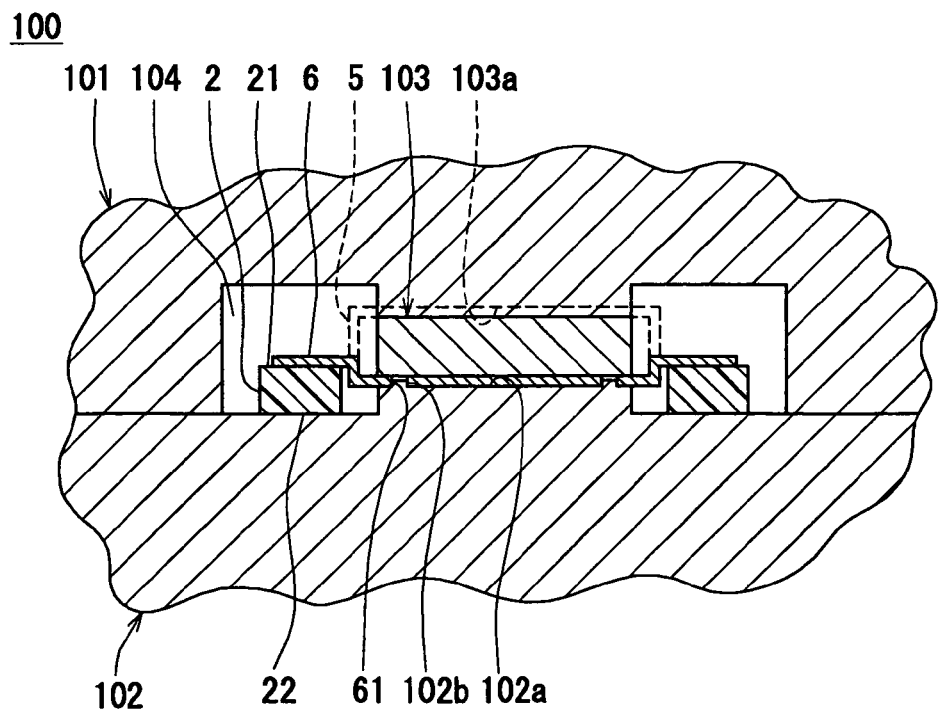
FIG. 5 is a sectional view taken from a line V to V in FIG. 4.

For instance, the second surface 22 of the circuit board 2 is arranged at a given position within the cavity 104 to closely contact a surface of the lower metal mold 102, while the negative terminal 6 is engaged in a groove 102a provided on the lower metal mold 102, as shown in FIG. 5. At the same time, a positioning pin 102b provided on the lower metal mold 102 for positioning is inserted to the through-hole 61 of the negative terminal 6, thus allowing the circuit board 2 to be arranged in the given position within the cavity 104.

The depth (vertical dimension in FIG. 5) of the groove 102a is designed to accord with a plate thickness of the negative terminal 6. After the circuit board 2 is placed in the cavity 104, both the lower metal mold 102 and the negative terminal 6 (engaged in the groove 102a) form a flat surface, as shown in FIGS. 4, 5.

The height of the positioning pin 102b of the lower metal mold 102 is slightly smaller than the plate thickness of the negative terminal 6. After the circuit board 2 is placed in the cavity 104, the tip of the positioning pin 102b does not protrude towards the cavity 104 from the surface of the negative terminal 6, allowing the slide core 103 to smoothly move.

In this example embodiment, two pairs of the through-hole 61 and positioning pin 102b are provided for enhancing positioning accuracy; however, the number of pairs can be any number as needed without limited to two.

Thus-arranged metal mold 100 is then tightened up; namely, the lower metal mold 102 and slide core 103 are moved upward in FIG. 4 to contact the upper metal mold 101 while the positive terminal 5 is engaged in a groove 101a on the upper metal 101.

The depth (vertical dimension in FIG. 5) of the groove 101a is designed to accord with a plate thickness of the positive terminal 5. After the metal mold 100 is tightened up, both the upper metal mold 101 and the positive terminal 5 engaged in the groove 101a form a flat surface, as shown in FIGS. 4, 5. This also allows the upper metal mold 101, the slide core 103, and the lower metal mold 102 to closely contact one another.

The slide core 103 moves through a gap between the terminals 5, 6 from the left side to the right side in FIG. 4 and then stops at the position shown in FIG. 4 while contacting the terminals 5, 6. Subsequently, the pressure within the vacuum hole 108 is decreased to suck the circuit board 2, allowing the circuit board 2 to closely contact the surface of the lower metal mold 102. Thus, a supporting process for supporting the circuit board 2 within the cavity 104 is completed as shown in FIG. 4.

Then, a temperature of the metal mold 100 is increased to a temperature suitable for thermosetting reaction of the epoxy resin, i.e., 170 degrees Celsius in this example embodiment.

After the temperature of the metal mold 100 becomes stable at 170 degrees Celsius, a nozzle of an injection unit (not shown) is joined at an upward end of the sprue 105 of the upper metal mold 101; then, liquefied epoxy resin is injected via the gate 106 to fill the cavity 104. When the resin pervades the cavity 104 and then sprue 105 is filled with the resin, injecting the resin is stopped to end the filling process.

The resin filling the cavity 104 is subjected to a thermosetting reaction within the metal mold 100, resulting in solidification of the resin to end the solidifying process.

Subsequently, the lower metal mold 102 and slide core 103 are caused to move downward in FIG. 4 to depart from the upper metal mold 101 while the slide core 103 moves leftward to be separated at the same time.

Applying the negative pressure to the vacuum hole 108 is then stopped to return the pressure of the vacuum hole 108 to atmosphere pressure; then, the knockout pin 107 is caused to move upward in FIG. 4 to release the casing 4 off the lower metal mold 102, ending the releasing process and all the molding process.

Figure 3:
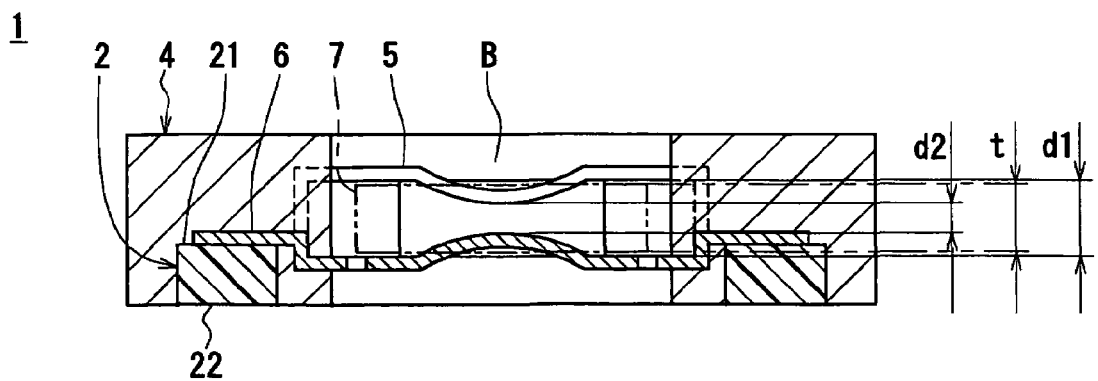
FIG. 3 is a sectional view taken from a line III to III in FIG. 2.

Next, a pressing process is applied to the terminals 5, 6; namely, the pressing is applied to, of each terminal 5, 6, a portion exposed to the battery containing space B to obtain a shape shown in FIG. 3 where a minimum distance d2 (in a direction of a thickness of the battery 7) of the gap between the terminals 5, 6 is formed to be smaller than a thickness t of the battery 7. To applying the pressing process to each terminal 5, 6, each terminal 5, 6 required to be fixedly supported at a portion near the casing 4 for preventing damage during the pressing process. For instance, force is applied around a central portion of each terminal 5, 6 and transmitted towards the casing 4 and circuit board 2 to cause a possible damage of the casing 4 or possible peeling of the soldering between each terminal 5, 6 and the circuit board 2. The pressing process ends to terminate the production process of producing the electronic key communicating apparatus 1 of this example embodiment.

As explained above, the electronic key communicating apparatus 1 of this example embodiment is formed as below. The casing 4 is formed with an insert molding process, i.e., by sealing using resin the circuit board 2 along with the mounted circuit component 3 and end portions of the positive and negative terminals 5, 6 mounted on the board 2. Here, the circuit component 3 and end portions of the terminals 5, 6 are mounted on one (first) surface of the circuit board 2; the second surface 22 of the circuit board 2 is included as a part of an outer surface of the casing 4. Furthermore, the recess line portion 23 is provided in the circuit board 2 for surrounding the battery 7; the terminals 5, 6 pass through an area or space formed by the recess line portion 23 and are attached or mounted on the circuit board 2 at both end portions of the terminals 5,6.

This structure of the apparatus 1 can remove one of surface walls of a casing included in a conventional apparatus, making the thickness of the apparatus 1 smaller than that of the conventional apparatus.

Furthermore, in the insert molding process where the circuit board 2 is inserted within the casing 4, a mold for forming the battery containing space B can be inserted between both the terminals 5, 6 via an opening of the recess line portion 23 of the circuit board 2, allowing the structure of the metal mold 100 to be simple and enhancing the productivity. Therefore, the slide core (slide type mold) 103 can be adopted to decrease the number of production processes and, in addition, the thickness of the apparatus 1.

Furthermore, the terminals 5, 6 are exposed within the battery containing space B included in the casing 4, so that the pressing process can be easily applied to the terminals 5, 6 after the molding process. This allows the terminals 5, 6 to have shapes to contact, with pressure, both the electrodes of the battery 7, respectively.

Furthermore, the through-hole 61 is provided in, of the negative terminal 6, the portion present within the battery containing space B; in the molding process, the through-hole 61 is engaged with the positioning pin 102b provided in the lower metal mold 102 so as to position the circuit board 2 within the cavity 104.

The positioning of a circuit board within a cavity of a metal mold can be achieved by, e.g., engaging a positioning pin provided in a lower metal mold with a hole provided in the circuit board; however, this hole visible after the production process deteriorates appearance of the casing, requiring an additional process to fill the hole with resin or the like and then shaping a surface into a flat one. This poses a problem such as increasing a cost.

In contrast, positioning using the through-hole 61 provided in the negative terminal 6 allows the through-hole 61 to eventually become invisible as appearance since the through-hole 61 is hided by the battery cover (not shown) attached to the casing 4 after the battery is inserted. Thus, the above positioning in the example embodiment allows the circuit board 2 to be accurately arranged within the cavity 104 of the metal mold 100 without increasing the cost due to the additional process, which enhances the productivity of the apparatus 1.

Furthermore, in the above production process of the casing 4, the vacuum hole 108 provided in the lower metal mold 102 is sucked with negative pressure to support the circuit board 2 within the cavity 104; however, this vacuum hole or sucking process can be eliminated. In this case, the circuit board 2 is accurately placed at the given position by engaging the positioning pin 102b with the through-hole 61 in the negative terminal 6.

Furthermore, the example embodiment as an electronic circuit apparatus is adapted to the vehicular electronic key communicating apparatus 1; however, it can be adapted to any one without limited to the above. For instance, it can be adapted to other types of electronic circuit apparatuses. Yet furthermore, without limited to an application for vehicles, it can be adapted to an electronic circuit apparatus for a consumer use.

It will be obvious to those skilled in the art that various changes may be made in the above-described example embodiments of the present invention. However, the scope of the present invention should be determined by the following claims.

What is claimed is:

1. An electronic circuit apparatus to which a battery of a button type is to be inserted as a power source, the electronic circuit apparatus comprising:
   an electronic component to be powered by the battery;
   a positive terminal for contacting a positive electrode of the battery;
   a negative terminal for contacting a negative electrode of the battery;
   a circuit board for including a recess line portion, wherein the electronic component and both end portions of each of the positive terminal and the negative terminal are attached to a first surface of the circuit board; and
   a casing for including the circuit board by sealing, using resin, the circuit board in addition to the electronic component and the both end portions of each of the positive terminal and the negative terminal, wherein
   a second surface opposite to the first surface of the circuit board is included as a part of an outer surface of the casing,
   the casing further includes a battery containing space, which is surrounded by the recess line portion of the circuit board, for detachably containing the battery,
   a part of each of the positive terminal and the negative terminal appears within the battery containing space, and
   when the battery is not inserted, a distance between the positive terminal and the negative terminal in a direction of a thickness of the battery that is to be inserted is shorter than the thickness of the battery.

2. The electronic circuit apparatus of claim 1, wherein the casing has a planar size similar to a card.

3. The electronic circuit apparatus of claim 1, wherein a part of at least one of the positive terminal and the negative terminal, which appears within the battery containing space, includes a through-hole.

4. A production method for producing the electronic circuit apparatus of claim 3, the production method comprising:
   supporting the circuit board in a given portion within a cavity of a mold for forming the casing by engaging a positioning pin, which is provided in the mold, in the through-hole included in the part of the at least one of the positive terminal and the negative terminal;
   filling the cavity with a liquid of the resin;
   solidifying the liquid of the resin within the cavity;
   releasing off the mold the casing, which has been formed after the solidifying the liquid of the resin; and
   applying a pressing process to the positive terminal and the negative terminal within the battery containing space to cause the distance between the positive terminal and the negative terminal in the direction of the thickness of the battery to be shorter than the thickness of the battery.

5. A production method for producing the electronic circuit apparatus of claim 1, the production method comprising:
   supporting the circuit board in a given portion within a cavity of a mold for forming the casing;
   filling the cavity with a liquid of the resin;
   solidifying the liquid of the resin within the cavity;
   releasing off the mold the casing, which has been formed after the solidifying the liquid of the resin; and
   applying a pressing process to the positive terminal and the negative terminal within the battery containing space to cause the distance between the positive terminal and the negative terminal in the direction of the thickness of the battery to be shorter than the thickness of the battery.

6. The production method of claim 5, wherein
   in the supporting of the circuit board in the given portion within the cavity, a positioning pin provided in the mold is engaged in a through-hole included in a part of at least one of the positive terminal and the negative terminal that appears within the battery containing space.

* * * * *